United States Patent
Jonas et al.

(10) Patent No.: US 9,500,730 B2
(45) Date of Patent: Nov. 22, 2016

(54) REDUCED-GAS-FLOW ELECTRICAL LEADS FOR SUPERCONDUCTING MAGNET SYSTEM

(71) Applicant: KONINKLIJKE PHILIPS N.V., Eindhoven (NL)

(72) Inventors: Philip Alexander Jonas, Eindhoven (NL); Glen George Pfleiderer, Eindhoven (NL); Ronald Ellsworth Hintz, Eindhoven (NL); Philippe Abel Menteur, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/774,243

(22) PCT Filed: Mar. 5, 2014

(86) PCT No.: PCT/IB2014/059455
§ 371 (c)(1),
(2) Date: Sep. 10, 2015

(87) PCT Pub. No.: WO2014/141003
PCT Pub. Date: Sep. 18, 2014

(65) Prior Publication Data
US 2016/0041240 A1 Feb. 11, 2016

Related U.S. Application Data

(60) Provisional application No. 61/782,183, filed on Mar. 14, 2013.

(51) Int. Cl.
*G01R 33/30* (2006.01)
*H01F 6/04* (2006.01)
(Continued)

(52) U.S. Cl.
CPC ........... *G01R 33/3815* (2013.01); *G01R 33/30* (2013.01); *G01R 33/3804* (2013.01); *G01R 33/385* (2013.01); *H01F 6/04* (2013.01)

(58) Field of Classification Search
CPC .............. G01R 33/3815; G01R 33/30; G01R 33/3804; G01R 33/385
See application file for complete search history.

(56) References Cited

U.S. PATENT DOCUMENTS 3,412,320 A * 11/1968 Marshall ................. F17C 3/085
174/15.4
4,369,636 A * 1/1983 Purcell ................... H02G 15/34
174/15.4
(Continued)

FOREIGN PATENT DOCUMENTS

CN 201435457 Y 3/2010
EP 0791998 A1 8/1997
(Continued)

*Primary Examiner* — Colleen Dunn

(57) ABSTRACT

A device is employed for an apparatus including an electrically conductive coil (230) which is disposed within a cryostat (210) and which is configured to produce a magnetic field when an electrical current is passed therethrough. The device dissipates heat from an electrical contact which is disposed within the cryostat and which is configured to supply electrical power to the electrically conductive coil, The device includes: a cooling gas circuit (326) configured to supply a cooling gas to the electrical contact which is disposed within the cryostat and configured to supply electrical power to the electrically conductive coil; and a heat exchanger (308) disposed within the cryostat and configured transfer heat from the electrical contact to the cooling gas to raise the temperature of the cooling gas.

20 Claims, 4 Drawing Sheets

(51) Int. Cl.
*G01R 33/3815* (2006.01)
*G01R 33/38* (2006.01)
*G01R 33/385* (2006.01)

(56) References Cited

U.S. PATENT DOCUMENTS 5,166,776 A * 11/1992 Dederer ............... F17C 13/006
 257/716

5,440,888 A * 8/1995 Cottevieille ............ F17C 9/00
 62/50.7

FOREIGN PATENT DOCUMENTS

| | | |
|---|---|---|
| JP | 61208206 S | 9/1986 |
| JP | 0294503 H | 4/1990 |
| JP | 06333737 H | 12/1994 |

* cited by examiner

REDUCED-GAS-FLOW ELECTRICAL LEADS FOR SUPERCONDUCTING MAGNET SYSTEM

CROSS-REFERENCE TO PRIOR APPLICATIONS

This application is the U.S. National Phase application under 35 U.S.C. §371 of International Application No. PCT/IB2014/059455, filed on Mar. 5, 2014, which claims the benefit of U.S. patent application Ser. No. 61/782183, filed on Mar. 14, 2013. These applications are hereby incorporated by reference herein.

TECHNICAL FIELD

The present invention generally pertains to electrical leads for use with a superconducting magnet in a cryogenic environment.

BACKGROUND AND SUMMARY

Superconducting magnets are used in a variety of contexts, including nuclear magnetic resonance (NMR) analysis, and magnetic resonance imaging (MRI). To realize superconductivity, a magnet is maintained in a cryogenic environment at a temperature near absolute zero. Typically, the magnet includes one or more electrically conductive coils which are disposed in a cryostat and are cooled by a cryogenic fluid such as liquid helium.

Many superconducting magnets operate in "persistent mode." In persistent mode, one (or more) superconducting electrically conductive coil(s) which form the superconducting magnet is initially energized with current from an external power supply to start up its magnetic field. Once the desired magnetic field is obtained, the power supply is disconnected from the magnet and the magnet maintains the current and the magnetic field due to its superconductivity.

High current electrical leads provide a low electrical resistance path between the external power supply and the superconducting electrically conductive coil(s), while limiting thermal heat conduction into those the superconducting electrically conductive coil(s). These high current electrical leads have electrical connections that are made between their ends and the corresponding ends of a pair of magnet leads which extend from the superconducting electrically conductive coil(s). The electrical connection(s) between the high current electrical leads and the leads which are connected to the superconducting electrically conductive coil(s) may be a source of heat when conducting high currents. Often these electrical connections may be made in a low temperature region in the cryostat and a large amount of cooling or gas (e.g., a cryogenic gas, such as low-temperature helium) is typically employed to cool these electrical connections to prevent the heat from being conducted into the superconducting coil region. If too much heat is conducted into the vicinity of the superconducting electrically conductive coil(s), then the superconducting electrically conductive coil(s) may heat up and become inoperable. The use of large amounts of cooling gas to cool the electrical leads is expensive and may require the system to have excess cryogen inventory. In some installations or environments, it may be difficult and/or expensive to obtain such cryogens.

An exemplary embodiment of the present invention can provide an apparatus including: a cryostat; an electrically conductive coil disposed within the cryostat and configured to produce a magnetic field when an electrical current is passed therethrough, and an electrical interconnection device disposed within the cryostat. The electrical interconnection device can include: a tank having a gas inlet disposed at a lower end thereof and a gas outlet disposed at an upper end thereof, a first electrically conductive lead configured to be selectively retractable and extendable, in a retracted position to be disposed substantially entirely outside the tank and in an extended position to extend at least partially into the tank, a second electrically conductive lead at least partially disposed within the tank and connected to the electrically conductive coil, an electrical contact disposed within the tank and being configured to connect the first and second electrically conductive leads together when the first electrically conductive lead is in the extended position, and a heat exchanger disposed adjacent the electrical contact within the tank and having a gas inlet disposed at a lower end thereof and a gas outlet disposed at an upper end thereof, wherein the heat exchanger is configured to receive a gas at the gas inlet thereof from the second electrically conductive lead and to output the gas at the gas outlet thereof.

In some embodiments, when the first electrically conductive lead is in the extended position, it can extend through the gas outlet of the tank.

In some versions of these embodiments, the cryostat can have an outer vacuum container, and the upper end of the tank is adjacent to the outer vacuum container.

In some versions of these embodiments, a heat sink can be disposed on the outer vacuum container, outside the tank.

In some embodiments, the electrical interconnection device can further include: a third electrically conductive lead configured to be selectively retractable and extendable, in a retracted position to be disposed substantially entirely outside the tank and in an extended position to extend at least partially into the tank; a fourth electrically conductive lead at least partially disposed within the tank and connected to the electrically conductive coil; and a second electrical contact disposed within the tank and being configured to connect the third and fourth electrically conductive leads together when the third electrically conductive lead is in the extended position.

In some versions of these embodiments, the heat exchanger can be disposed adjacent the second electrical contact and has a second gas inlet disposed at the lower end thereof, wherein the heat exchanger is configured to receive the gas at the second gas inlet thereof from the fourth electrically conductive lead.

In some versions of these embodiments, the apparatus can further include: a second heat exchanger disposed adjacent the second electrical contact within the tank and having a gas inlet disposed at a lower end thereof and a gas outlet disposed at an upper end thereof, wherein the second heat exchanger is configured to receive a gas at the gas inlet thereof from the fourth electrically conductive lead and to output the gas at the gas outlet thereof.

In some embodiments, the first electrically conductive lead can include a channel configured to pass the gas therethrough.

In some embodiments, the second electrically conductive lead can include a channel configured to pass the gas therethrough.

In some embodiments, the gas flow can be adjusted manually by means of a valve at the gas outlet.

In some embodiments, the gas flow can be adjusted automatically via a computer controlled valve at the gas outlet which can be adjusted via a feedback loop from one or more temperature sensors.

Another exemplary embodiment of the present invention can provide a method including: extending a first electrically conductive lead into a tank disposed in a cryostat so as to make an electrical connection with a second electrically conductive lead at least partially disposed within the tank and which can be connected to an electrically conductive coil disposed within the cryostat, wherein the electrically conductive coil is configured to produce a magnetic field when an electrical current is passed therethrough; providing a cooling gas to a gas inlet of the tank disposed at a lower portion of the tank; passing the cooling gas through a heat exchanger disposed within the tank so as to transfer heat from an electrical connection between the first and second electrically conductive leads to the cooling gas to convert the cooling gas to a heated gas; and dispensing the heated gas from a gas outlet of the tank disposed at an upper portion thereof.

In some embodiments, the method can further include breaking the electrical connection when the magnetic field has a selected field strength.

In some versions of these embodiments, the method can further include retracting the first electrically conductive lead from the tank.

In some embodiments, the electrically conductive coil can have a temperature of less than 10° K, while the first electrically conductive lead can have a temperature of at least 20° K.

In some embodiments, the electrically conductive coil can have a temperature of less than 5° K, while the first electrically conductive lead can have a temperature of at least 40° K.

In some embodiments, dispensing the heated gas from a gas outlet of the tank disposed at an upper portion thereof can include dispensing the heated gas via an aperture provided in the first electrically conductive lead, wherein the heated gas flows through the first electrically conductive lead.

In yet another aspect of the present invention, a device can be provided for an apparatus comprising an electrically conductive coil disposed within a cryostat and which can be configured to produce a magnetic field when an electrical current is passed therethrough, a device for dissipating heat from an electrical contact disposed within the cryostat and which can be configured to supply electrical power to the electrically conductive coil. The device can include: a cooling gas conduit configured to supply a cooling gas to the electrical contact disposed within the cryostat and configured to supply electrical power to the electrically conductive coil; and a heat exchanger disposed within the cryostat and configured transfer heat from the electrical contact to the cooling gas to raise a temperature of the cooling gas.

In some embodiments, the device can further include a tank disposed within the cryostat, the tank having a gas inlet disposed at a lower end thereof and a gas outlet disposed at an upper end thereof, wherein the electrical contact and the heat exchanger are disposed within the tank.

In some versions of these embodiments, the heat exchanger can be disposed adjacent the electrical contact within the tank and has a gas inlet disposed at a lower end thereof and a gas outlet disposed at an upper end thereof, wherein the heat exchanger is configured to receive the cooling gas at the gas inlet thereof from the second electrically conductive lead and to output the cooling gas at the gas outlet thereof.

In some versions of these embodiments, a first electrically conductive lead can be configured to be selectively retractable and extendable, in a retracted position to be disposed substantially entirely outside the tank and in an extended position to extend at least partially into the tank.

BRIEF DESCRIPTION OF THE DRAWINGS

The present invention will be more readily understood from the detailed description of exemplary embodiments presented below considered in conjunction with the accompanying drawings, in which.

DETAILED DESCRIPTION

The present invention will now be described more fully hereinafter with reference to the accompanying drawings, in which embodiments of the present invention are shown. The present invention may, however, be embodied in different forms and should not be construed as limited to the embodiments set forth herein. Rather, these embodiments are provided as examples of the invention. Within the present disclosure and claims, when something is said to have approximately a certain value, then it means that it is within 10% of that value, and when something is said to have about a certain value, then it means that it is within 25% of that value.

Figure 1:
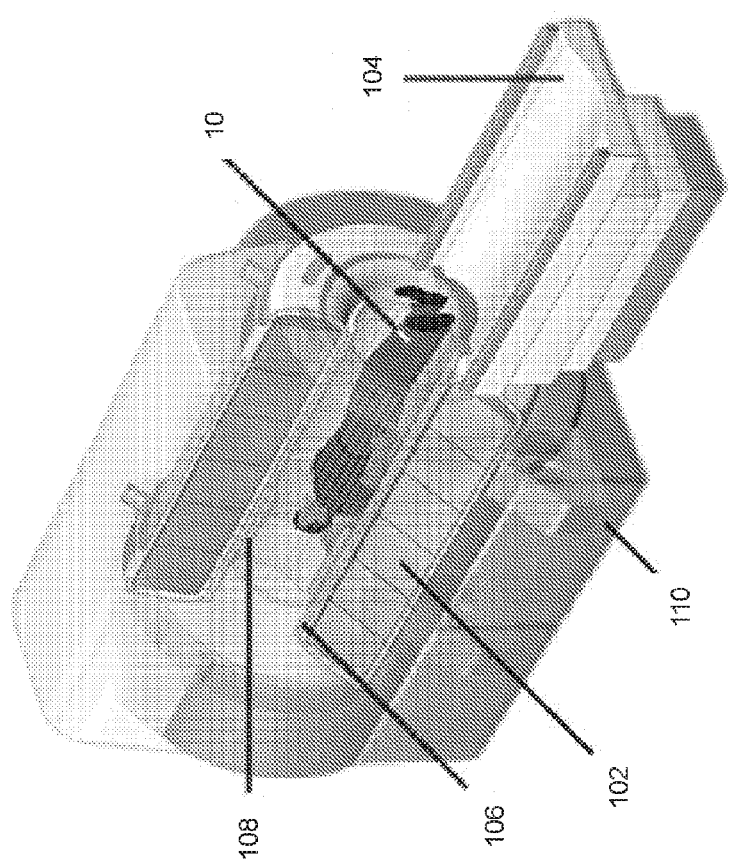
FIG. 1 illustrates an exemplary embodiment of a magnetic resonance imaging (MRI) apparatus.

FIG. 1 illustrates an exemplary embodiment of a magnetic resonance imaging (MRI) apparatus 100. As shown in FIG. 1, MRI apparatus 100 can include a magnet 102; a patient table 104 configured to hold a patient 10; gradient coils 106 configured to at least partially surround at least a portion of patient 10 for which MRI apparatus 100 generates an image; and a radio frequency coil 108 configured to apply a radio frequency signal to at least the portion of patient 10 which is being imaged. The general operation of an MRI apparatus is well known and therefore will not be repeated here.

Figure 2:
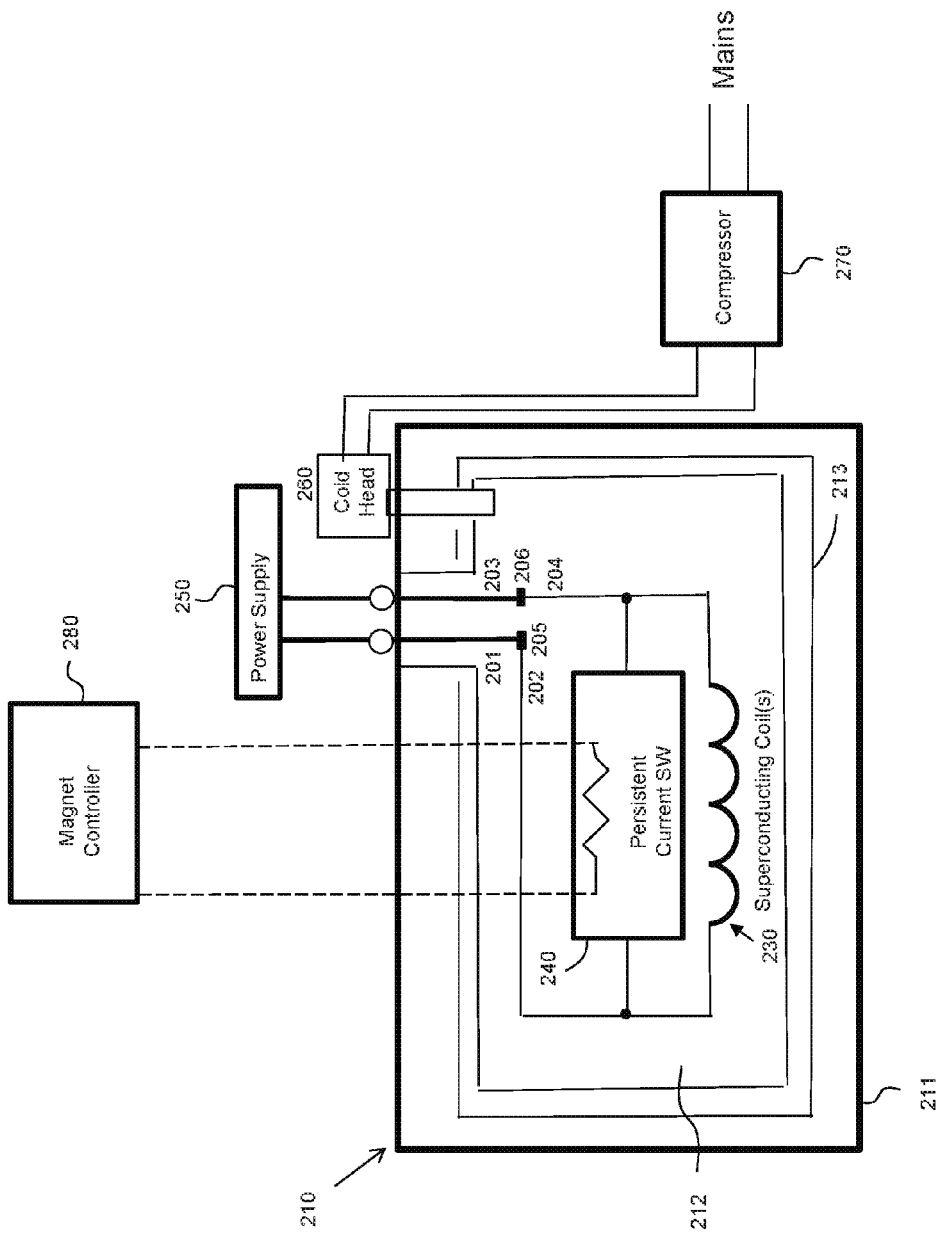
FIG. 2 illustrates one example embodiment of a superconducting magnet system which may be employed in an MRI apparatus.

FIG. 2 illustrates one example embodiment of a superconducting magnet system 200 which may be employed in an MRI apparatus, such as MRI apparatus 100. In particular, superconducting magnet system 200 may be one embodiment of magnet 102 in MRI apparatus 100. It should be understood that, in general, superconducting magnet system 200 may include many other components which are not illustrated in FIG. 2. Some components have been omitted from FIG. 2 for clarity of illustration, and so as not to obscure aspects of the present invention to be discussed below.

Superconducting magnet system 200 can include a cryostat 210 having an enclosure or outer vacuum container 211, a thermal shield 213 disposed within enclosure 211, and a helium tank 212.

Superconducting magnet system 200 can include one or more electrically conductive coil(s) 230, a persistent current switch 240 disposed within helium tank 212 of cryostat 210, and a power supply 250 disposed outside of (external to) cryostat 210. Superconducting magnet system 200 can further include a cold head 260 driven by a compressor 270 to recondense helium from helium tank 212. Superconducting magnet system 200 can further include a magnet controller 280 which may control various operations of superconducting magnet system 200.

Superconducting magnet system 200 can further include first and second electrically conductive leads 201 and 202 and third and fourth electrically conductive leads 203 and 204. First and second electrically conductive leads 201 and 202 can be connected to each other at an electrical contact 205, and third and fourth electrically conductive leads 203 and 204 can be connected to each other at an electrical contact 206. First electrically conductive lead 201 can be connected to power supply 250 via a switch. Third electrically conductive lead 203 can also be connected to power supply 250. Second and fourth electrically conductive leads 202 and 204 can be connected to opposite ends of electrically conductive coil(s) 230.

Beneficially, superconducting magnet system 200 is a helium bath type system. In some embodiments, helium tank 212 may contain a relatively small amount of cryogenic fluid compared to helium volumes in typical helium bath type systems, for example 50 to 100 liters (or less) of liquid helium.

Persistent current switch 240 can be disposed within helium tank 212 and may include a piece of superconductor wire connected across opposite ends of electrically conductive coil(s) 230 via second and fourth electrically conductive leads 202 and 204, attached to a small heater.

Superconducting magnet system 200 may have one or more sensors (not shown in FIG. 2) for measuring various operating parameters, such as, for example, temperatures, at various locations, levels of cryogenic fluid (e.g., liquid helium), whether components such as compressor 270 are properly operating, whether the power has been lost, for example due to an electrical power outage, etc. Each sensor may be connected to magnet controller 280 and supply a corresponding sensor signal to magnet controller 280.

Magnet controller 280 may include a processor and memory, including nonvolatile memory and volatile memory. The nonvolatile memory may store programming code or instructions (software) for causing the processor to execute one or more processes for controlling operations of superconducting magnet system 280, as described in greater detail below. In some embodiments, first and third electrically conductive leads 201 and 203 may be retractable.

During a startup operation of superconducting magnet system 200, retractable leads 201 and 203 can be inserted into helium tank 212 and the wire in persistent current switch 240 can be heated above its transition temperature so that it becomes resistive. In some embodiments, first and third electrically conductive leads 201 and 203 may each have a protruding pin at an end thereof which may be received and coupled into a socket provided in each of electrical contacts 205 and 206.

Electrically conductive coil(s) 230 can be initially energized by external power supply 250 passing a current through electrically conductive coil(s) 230. Since the wire in persistent current switch 240 is heated during the startup operation, its resistance is substantially greater than that of electrically conductive coil(s) 230, so the current from the external power supply passes through electrically conductive coil 230.

To transition to operation in persistent mode, the current through electrically conductive coil(s) 230 is adjusted until the desired magnetic field is obtained, then the heater in persistent current switch 240 is turned off. After the heater is turned off, the superconductor wire in persistent current switch 240 cools to its superconducting temperature, short-circuiting electrically conductive coil(s) 230, which as mentioned above is also superconducting. The current in the power supply is ramped down and leads 201 and 203 are retracted from helium tank 212.

The connections between first and third electrically conductive leads 201 and 203 and electrical contacts 205 and 206, respectively, often have a resistance that is much greater than a bolted and soldered connection and can be a source of heat when conducting high currents while electrically conductive coil(s) 230 is/are being energized. With these connections being made in a low temperature region, such as helium tank 212, it may require a large amount of a cooling gas (e.g., cold helium gas) to prevent heat from being conducted into the vicinity of electrically conductive coil(s) 230. As explained above, if too much heat is conducted into the vicinity of superconducting coil 230, then electrically conductive coil(s) 230 may heat up and become inoperable. Furthermore, the use of large amounts of helium gas to cool first and third electrically conductive leads 202 and 203 and electrical contacts 205 and 206 could be expensive and may require the system to have excess cryogen inventory, which may be difficult to supply in some installations.

Figure 3:
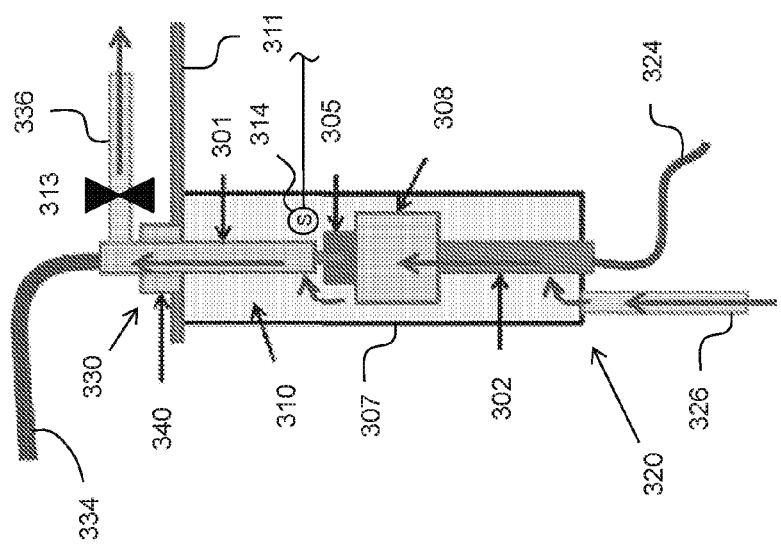
FIG. 3 illustrates one exemplary embodiment of an arrangement of low-gas-flow electrical leads for a superconducting magnet system.

FIG. 3 illustrates one exemplary embodiment of an arrangement 300 of low-gas-flow electrical leads for a superconducting magnet system, such as superconducting magnet system 200, which may at least in part mitigate the need for a large amount of cooling gas (e.g., cold helium gas). Arrangement 300 can include: a vessel or tank 307 (hereinafter referred to as "electrical lead tank 307"), a first electrically conductive lead 301, a second electrically conductive lead 302, an electrical contact 305, and a heat exchanger 308. In arrangement 300, electrical lead tank 307 is connected (e.g., thermally connected) to an outer vacuum container 311 and a thermal sink 340. Beneficially, heat exchanger 308 is thermally coupled to electrical contact 305.

When arrangement 300 is applied to superconducting magnet system 200, first electrically conductive lead 301 may be an embodiment of first electrically conductive lead 201, second electrically conductive lead 302 may be an embodiment of second electrically conductive lead 202, electrical contact 305 may be an embodiment of electrical contact 205, and outer vacuum container 311 may be an embodiment of enclosure 211. Electrical lead tank 307 may be disposed in helium tank 212 of cryostat 210.

Beneficially, first electrically conductive lead 301 is configured to be selectively retractable and extendable, in a retracted position to be disposed substantially entirely outside electrical lead tank 307, and in an extended position to extend at least partially into electrical lead tank 307. When arrangement 300 is applied to superconducting magnet system 200, first electrically conductive lead 301 may be configured in the retracted position to be disposed entirely, or substantially entirely, outside helium tank 212. In some embodiments, first electrically conductive lead 301 may be configured in the retracted position to be disposed entirely, or substantially entirely, outside cryostat 210. Furthermore, first electrically conductive lead 301 may be connected to power supply 250 via an intermediate electrically conductive wire 334.

Beneficially, second electrically conductive lead 302 is at least partially disposed within electrical lead tank 307. When arrangement 300 is applied to superconducting magnet system 200, second electrically conductive lead 302 is connected to electrically conductive coil(s) 230 via an intermediate low temperature superconducting electrically conductive wire 324.

When first electrically conductive lead 301 is in the extended position, it is makes an electrical connection with second electrically conductive lead 302 via electrical contact 305. In some embodiments, first electrically conductive lead 301 may have a protruding pin at an end thereof which may be received and coupled into a socket provided in electrical contact 305. As explained above, the connection between first electrically conductive lead 301 and electrical contact 305 may have a resistance that is significantly greater than that of a bolted and soldered connection and can be a source of heat when conducting high currents while electrically conductive coil(s) 230 is/are being energized to produce a magnetic field. In some embodiments, first electrically conductive lead 301 may be heated to have a temperature of at least 20° K, while electrically conductive coil(s) 230 is/are being cooled to a temperature of less than 10° K. In some embodiments, first electrically conductive lead 301 may be heated to have a temperature of at least 50° K, while electrically conductive coil(s) is/are being cooled to a temperature of less than 5° K. Accordingly, to prevent or reduce heat transfer from first electrically conductive lead 301 to electrically conductive coil(s) 230, arrangement 300 may operate to transfer heat from the interconnection of first electrically conductive lead 301 and electrical contact 305 to a cooling gas (e.g., cold helium gas).

Toward that objective, electrical lead tank 307 can have a gas inlet 320 at a lower end thereof, and a gas outlet 330 at an upper end thereof. Electrical lead tank 307 may be an enclosed vessel, except for gas inlet 320 and gas outlet 330, and any passages required for first and second electrically conductive leads 301 and 302, etc. Cooling gas may be supplied to electrical lead tank 307 via a cooling gas supply line 326 at gas inlet 320, and may be dispensed from electrical lead tank 307 via a gas exhaust line 336. Beneficially, first and second electrically conductive leads 301 and 302 each include a channel through which the cooling gas may flow. In some embodiments, first and second electrically conductive leads 301 and 302 may each comprise a cylindrical structure with a hollow region forming the channel for the cooling gas to pass through. First and second electrically conductive leads 301 and 302 may each have a first hole or aperture at a lower portion or end thereof as an inlet for receiving the cooling gas, and a second hole or aperture at an upper portion or end thereof as an outlet for dispensing the cooling gas therefrom.

Operationally, when it is desired to energize electrically conductive coil(s) 230, first electrically conductive lead 301 may be extended into electrical lead tank 307 to be contacted to electrical contact 305 and establish an electrical connection to second electrically conductive lead 302. Current may then be supplied from power supply 250 and passed through electrically conductive coil(s) 230 to energize electrically conductive coil(s) 230 and form the desired magnetic field. In some embodiments, these operations may be performed under control of magnet controller 280. For example, magnet controller 280 may operate a motor which retracts and extends first electrically conductive lead 301.

To provide an example, in some embodiments the resistance of the interconnection between electrically conductive lead 301 and electrical contact 305 may be on the order of 0.3 milliohms, and the peak current which is supplied from power supply 250 through the interconnection of first electrically conductive lead 301 and electrical contact 305 may be 500 amps. In that case, the voltage drop across the interconnection would be 15 mV, and the heat generated by the interconnection would be 500*15 mV=7.5 watts. If this 7.5 watts of thermal energy was allowed to the transferred to the vicinity of electrically conductive coil(s) 230, then electrically conductive coil(s) 230 would not achieve the low temperatures required for superconductivity and/or would cause excessive helium boil off.

Heat exchanger 308 can be closely coupled thermally to electrical contact 305 and, for example, they may be in direct physical contact with each other. Beneficially, the temperature of heat exchanger 308 inside electrical lead tank 307 is allowed to float with respect to the temperature in helium tank 212 external to electrical lead tank 307, and particularly with respect to the temperature of electrically conductive coil(s) 230. Accordingly, when the temperature of electrical contact 305 rises due to first electrically conductive lead 301 being extended into electrical lead tank 307 to be contacted to electrical contact 305 to energize electrically conductive coil(s) 230, then the temperature of heat exchanger 308 is also allowed to rise. During this time, a cooling gas (e.g., cold helium gas at a temperature of, for example, about 5° K) is supplied to electrical lead tank 307 via a cooling gas supply line 326 at gas inlet 320. The cooling gas is provided from lead tank 307 to heat exchanger 308 at a lower end thereof, for example via a channel in second electrically conductive lead 302. As the cooling gas passes through or over heat exchanger 308, it absorbs thermal energy generated by the connection between first electrically conductive lead 301 and contact 305, and as a result the cooling gas is heated. Beneficially, heat exchanger 308 is configured to provide a lengthy (e.g., circuitous) path for the cooling gas to travel to increase its opportunity to absorb heat. Beneficially, heat exchanger 308 is configured to use as much, or nearly as much, enthalpy of the helium gas as possible for a given volume of space occupied by heat exchanger 308. In this way, the temperature of the interconnection may be allowed to rise, for example to a temperature >50° K, which improves the cooling efficiency of the cooling gas so that a substantially reduced amount of cooling gas may be required. That is, a reduced gas flow rate is employed to transfer heat to the cooling gas, and therefore less total cooling gas is required over the time interval when the magnet is being energized.

The cooling gas is thereby heated by heat exchanger 308 and the heated cooling gas is dispensed from an upper end of heat exchanger 308, for example, to an inlet at a lower end first electrically conductive lead 301, for example, via the interior of electrical lead tank 307. The heated cooling gas continues to first electrically conductive lead 301 to be dispensed at gas outlet 330 of electrical lead tank 307. In the embodiment illustrated in FIG. 3, gas exhaust line 336 is connected to an outlet at an upper end of first electrically conductive lead 301 to receive the heated cooling gas and dispense or exhaust it therefrom. Beneficially, thermal sink 340 is provided at the outside of electrical lead tank 307 and is connected to outer vacuum container 311 so as to provide a means of dissipating heat at the outlet of electrical lead tank 307. Thus, electrical lead tank 307 and first and second electrically conductive leads 301 and 302 form an example embodiment of a cooling gas conduit configured to supply a cooling gas to electrical contact 305 to absorb heat energy therefrom.

Once magnetic energization has been accomplished, then first electrically conductive lead 301 is retracted so as to no longer be in contact with or make an electrical connection with electrical contact 305. Beneficially, first electrically conductive lead 301 is retracted so as to be disposed at least partially outside of electrical lead tank 307. In some embodiments, first electrically conductive lead 301 is configured in the retracted position to be disposed entirely, or substantially entirely, outside of helium tank 212. In some embodiments, first electrically conductive lead 301 is configured in the retracted position to be disposed entirely, or substantially entirely, outside of cryostat 210. When first electrically conductive lead 301 is retracted so as to no longer be in contact with or make an electrical connection with electrical contact 305, then current stops flowing through electrical contact 305 and heat is no longer generated there. Beneficially, at this point the temperature of floating temperature heat exchanger 308 is allowed to float to a low temperature (e.g., about 5° K).

In some embodiments, the flow of gas through electrical lead tank 307 may be controlled by a valve 313. In some embodiments, valve 313 may be a manually-controlled valve. In some embodiments, valve 313 may be a processor-controlled valve configured to automatically adjust the gas flow via a feedback loop using one or more signals from one or more temperature sensors 314. In some embodiments, valve 313 may be controlled by magnet controller 280.

In some embodiments, the operations described above may be performed under control of magnet controller 280. For example, magnet controller 280 may control a valve, a pump, etc. to enable and disable the supply of the cooling gas to electrical lead tank 307. Also, magnet controller may control a motor to extend and retract first electrically conductive lead 301.

FIG. 3 illustrates one exemplary embodiment of an arrangement 300 of low-gas-flow electrical leads for a superconducting magnet system which selectively interconnects a pair of electrically conductive leads, for example first and second electrically conductive leads 201 and 202 in superconducting magnet system 200. However, superconducting magnet system 200 also includes an interconnection for a second pair of electrically conductive leads—third and fourth electrically conductive leads 203 and 204.

Accordingly, in some embodiments superconducting magnet system 200 may include one arrangement 300 for selectively interconnecting first and second electrically conductive leads 201 and 202, and another arrangement 300 for selectively interconnecting third and fourth electrically conductive leads 203 and 204.

In other embodiments, a single, common, electrical lead tank may be employed for both interconnections. In that case, the arrangement may include: a third electrically conductive lead (e.g., third electrically conductive lead 203) configured to be selectively retractable and extendable, in a retracted position to be disposed substantially entirely outside electrical lead tank 307 and in an extended position to extend at least partially into electrical lead tank 307; a fourth electrically conductive lead (e.g., fourth electrically conductive lead 204) at least partially disposed within electrical lead tank 307 and connected to the other end of electrically conductive coil(s); and a second electrical contact (e.g. electrical contact 206) disposed within electrical lead tank 307 and which is configured to connect the third and fourth electrically conductive leads together when the third electrically conductive lead is in the extended position. One or both of the third and fourth electrically conductive leads may have a channel disposed within through which the cooling gas may flow.

In some variations of these embodiments, each of the electrical contacts may be thermally coupled to its own separate heat exchanger. In other variations of these embodiments, heat exchanger 308 may be thermally coupled to both of the electrical contacts. In some of these variations, heat exchanger 308 may be disposed adjacent the second electrical contact and may have a second gas inlet disposed at the lower end thereof, wherein heat exchanger 308 is configured to receive the cooling gas at the second gas inlet thereof from the fourth electrically conductive lead.

Figure 4:
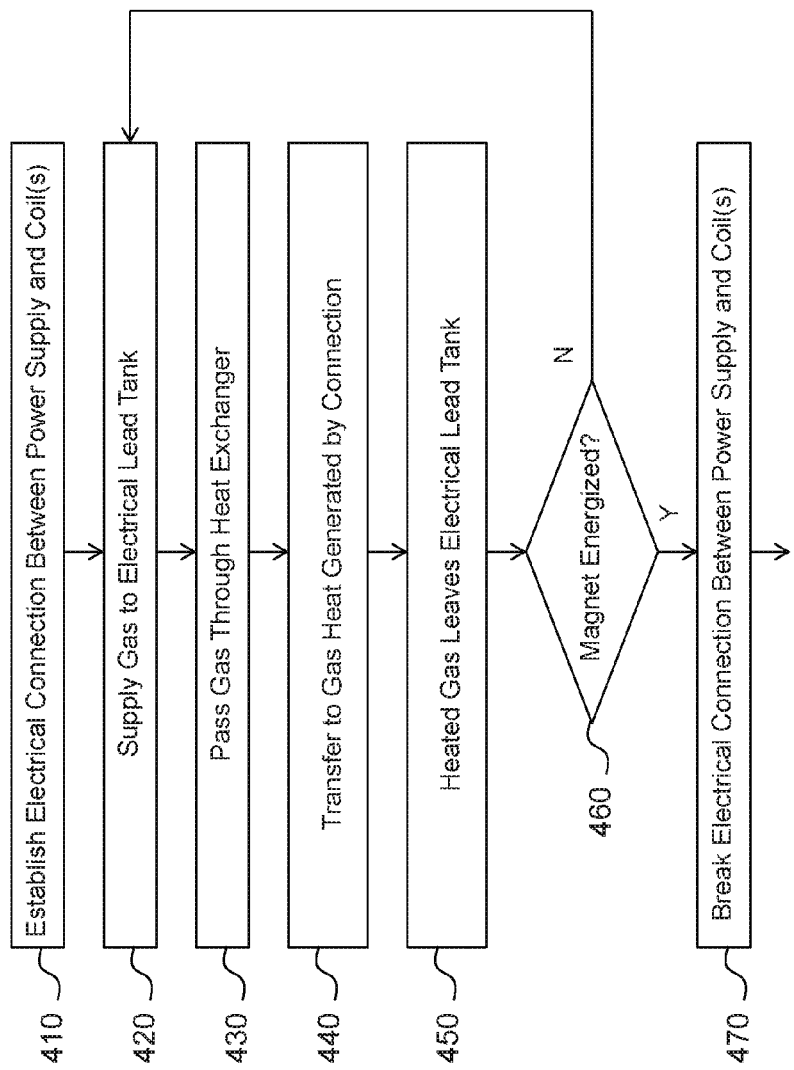
FIG. 4 is a diagram illustrating an exemplary method of energizing a magnet system having a superconducting magnet by means of low-gas-flow electrical leads.

FIG. 4 is a diagram illustrating an exemplary process 400 of energizing a magnet system having a superconducting magnet by means of low-gas-flow electrical leads, for example, via arrangement 300 described above. In some embodiments, process 400 may be performed under control of a processor, for example, a processor in a magnet controller, which executes a software algorithm based on a set of computer instructions stored in a memory.

In an operation 410, an electrical connection is established between a power supply and the electrically conductive coil(s) which will be employed to produce the desired magnetic field. In some embodiments, the connection is established by extending a first electrically conductive lead into an electrical lead tank disposed in an inner region of a cryostat, so as to make an electrical connection with a second electrically conductive lead which is at least partially disposed within the electrical lead tank and which is connected to the electrically conductive coil(s) which is/are also disposed within the cryostat. By means of this electrical connection, current is supplied from the power supply to the electrically conductive coil(s) to energize them and produce the desired magnetic field.

In an operation 420, a cooling gas is provided to a gas inlet which is disposed at a lower portion of the electrical lead tank.

In an operation 430, the cooling gas is passed over or through a heat exchanger disposed within the electrical lead tank.

In an operation 440, as a result of the gas passing through the heat exchanger, heat from the electrical connection between the first and second electrically conductive leads is transferred to the cooling gas to convert the cooling gas to a heated gas.

In an operation 450, the heated cooling gas is dispensed or exhausted from an outlet disposed at an upper portion of the electrical lead tank.

It should be understood that although operations 420, 430, 440 and 450 appear to be shown as sequential operations in FIG. 4, this is for illustration of the flow of the cooling gas. In reality, the operations 420, 430, 440 and 450 proceed in parallel with each other.

In operation 460, it is determined (for example by a processor in a magnet controller) whether or not the magnet energization is complete (e.g., whether or not the magnetic field is at a selected or desired field strength). If not, then the operations 420, 430, 440 and 450 are repeated. If so, then the process proceeds to operation 470.

In operation 470, the electrical connection between the power supply that the electrically conductive coil(s) is broken, and the magnet system proceeds with normal operation in a persistent mode. In some embodiments, the connection is broken by retracting the first electrically conductive lead from the electrical lead tank, which may include retracting the first electrically conductive lead from the inner region of the cryostat, and in some embodiments from the cryostat itself.

While preferred embodiments are disclosed herein, many variations are possible which remain within the concept and scope of the invention. For example, embodiments have been described above in the context of a helium bath type system. However, in other embodiments, it is possible that the principles disclosed herein may be adapted to be employed in a "cryofree" or sealed system. Such variations would become clear to one of ordinary skill in the art after inspection of the specification, drawings and claims herein. The present invention therefore is not to be restricted except within the scope of the appended claims.

What is claimed is:

1. An apparatus, comprising:
   an electrically conductive coil disposed within a cryostat and configured to produce a magnetic field when an electrical current is passed therethrough;
   an electrical interconnection device disposed within the cryostat, the electrical interconnection device comprising:
      a tank having a first lower end and a first upper end, the tank having a first gas inlet disposed at the first lower end and a first gas outlet disposed at the first upper end,
      a first electrically conductive lead which is configured to be selectively retractable and extendable, wherein in a retracted position the first electrically conductive lead is disposed substantially entirely outside the tank and in an extended position the first electrically conductive lead extends at least partially into the tank,
      a second electrically conductive lead at least partially disposed within the tank and connected to the electrically conductive coil,
      a first electrical contact disposed within the tank and being configured to connect the first and second electrically conductive leads together when the first electrically conductive lead is in the extended position, and
      a first heat exchanger having a second lower end and a second upper end, the first heat exchanger disposed adjacent the first electrical contact within the tank and having a second gas inlet disposed at the second lower end and a second gas outlet disposed at the second upper end,
      wherein the first heat exchanger is configured to receive a gas at the second gas inlet from the second electrically conductive lead and to output the gas at the second gas outlet.

2. The apparatus of claim 1, wherein when the first electrically conductive lead is in the extended position, it extends through the first gas outlet.

3. The apparatus of claim 2, wherein the cryostat has an outer vacuum container, and the upper end of the tank is adjacent to the outer vacuum container.

4. The apparatus of claim 3, further comprising a heat sink disposed on the outer vacuum container, outside the tank.

5. The apparatus of claim 1, wherein the electrical interconnection device further comprises:
   a third electrically conductive lead configured to be selectively retractable and extendable, in a retracted position to be disposed substantially entirely outside the tank and in an extended position to extend at least partially into the tank;
   a fourth electrically conductive lead at least partially disposed within the tank and connected to the electrically conductive coil; and
   a second electrical contact disposed within the tank and being configured to connect the third and fourth electrically conductive leads together when the third electrically conductive lead is in the extended position.

6. The apparatus of claim 5, wherein the first heat exchanger is disposed adjacent the second electrical contact and has a third gas inlet disposed at the first lower end, wherein the first heat exchanger is configured to receive the gas at the third gas inlet from the fourth electrically conductive lead.

7. The apparatus of claim 5, further comprising a second heat exchanger having a third lower end and a third upper end, the second heat exchanger disposed adjacent the second electrical contact within the tank and having a fourth gas inlet disposed at the third lower end and a fourth gas outlet disposed at the third upper end, wherein the second heat exchanger is configured to receive the gas at the fourth gas inlet from the fourth electrically conductive lead and to output the gas at the fourth gas outlet.

8. The apparatus of claim 1, wherein the first electrically conductive lead includes a channel configured to pass the gas therethrough.

9. The apparatus of claim 1, wherein the second electrically conductive lead includes a channel configured to pass the gas therethrough.

10. The apparatus of claim 1, further comprising a manually-controlled valve configured to control a flow of the gas.

11. The apparatus of claim 1, further comprising a processor-controlled valve configured to automatically adjust a flow of the gas via a feedback loop using one or more signals from one or more temperature sensors.

12. A method, comprising:
    extending a first electrically conductive lead into a tank disposed in a cryostat so as to make an electrical connection with a second electrically conductive lead which is at least partially disposed within the tank, wherein the second electrically conductive lead is connected to an electrically conductive coil wherein the electrically deductive coil is disposed within the cryostat, wherein the electrically conductive coil is configured to produce a magnetic field when an electrical current is passed therethrough;
    providing a cooling gas to a gas inlet of the tank, wherein the gas inlet is disposed at a lower portion of the tank;
    passing the cooling gas through a heat exchanger, wherein the heat exchanger is arranged within the tank so as to transfer heat from an electrical connection between the first and second electrically conductive leads to the cooling gas to convert the cooling gas to a heated gas; and
    dispensing the heated gas from a gas outlet of the tank, wherein the gas outlet is disposed at an upper portion of the tank.

13. The method of claim 12, further comprising breaking the electrical connection when the magnetic field has a selected field strength.

14. The method of claim 13, further comprising retracting the first electrically conductive lead from the tank.

15. The method of claim 12, wherein the electrically conductive coil has a temperature of less than 10° K, while the first electrically conductive lead has a temperature of at least 20° K.

16. The method of claim 12, wherein the electrically conductive coil has a temperature of less than 5° K, while the first electrically conductive lead has a temperature of at least 40° K.

17. The method of claim 12, wherein dispensing the heated gas from the gas outlet comprises dispensing the heated gas via an aperture provided in the first electrically conductive lead, wherein the heated gas flows through the first electrically conductive lead.

18. A device for dissipating heat from an electrical contact which is disposed within a cryostat and which is configured to supply electrical power to an electrically conductive coil, the device comprising:
- a cooling gas conduit configured to supply a cooling gas to the electrical contact, wherein the electrical contact is disposed within the cryostat and configured to supply electrical power to an electrically conductive coil;
- a heat exchanger disposed within the cryostat, wherein the heat exchanger is configured transfer heat from the electrical contact to the cooling gas to raise a temperature of the cooling gas; and
- a tank having a first lower end and a first upper end, the tank having a first gas inlet disposed at the first lower end and a first gas outlet disposed at the first upper end,
- wherein the electrical contact and the heat exchanger are disposed within the tank.

19. The device of claim 18, wherein the heat exchanger has a second lower end and a second upper end,
- wherein the heat exchanger is disposed adjacent the electrical contact within the tank and has a second gas inlet disposed at the second lower end and a second gas outlet disposed at the second upper end,
- wherein the heat exchanger is configured to receive the cooling gas at the second gas inlet from the second electrically conductive lead and to output the cooling gas at the second gas outlet.

20. The device of claim 18, a first electrically conductive lead which is configured to be selectively retractable and extendable,
- wherein the electrically conductive lead in a retracted position is arranged to be disposed substantially entirely outside the tank,
- wherein the electrically conductive lead in an extended position is arranged to extend at least partially into the tank.

* * * * *